United States Patent
Horie et al.

(10) Patent No.: US 6,791,181 B2
(45) Date of Patent: Sep. 14, 2004

(54) SEMICONDUCTOR LIGHT EMITTING DEVICE

(75) Inventors: Hideyoshi Horie, Ibaraki (JP); Nobuhiro Arai, Ibaraki (JP); Naoyuki Komuro, Ibaraki (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 09/995,802

(22) Filed: Nov. 29, 2001

(65) Prior Publication Data

US 2002/0063329 A1 May 30, 2002

(30) Foreign Application Priority Data

Nov. 29, 2000 (JP) ....................................... 2000-362511

(51) Int. Cl.[7] .............................................. H01L 23/34
(52) U.S. Cl. ........................ 257/706; 257/707; 257/712; 438/122; 385/88; 372/36
(58) Field of Search ................................ 257/706, 433, 257/707, 712–721; 438/122; 372/36; 385/88

(56) References Cited

U.S. PATENT DOCUMENTS

| | | | | |
|---|---|---|---|---|
| 3,867,003 A | * | 2/1975 | Morton et al. | 438/485 |
| 4,091,408 A | * | 5/1978 | Lee et al. | 257/523 |
| 4,566,027 A | * | 1/1986 | Heitzmann et al. | 257/702 |
| 5,454,002 A | * | 9/1995 | McCann | 372/36 |
| 5,544,269 A | * | 8/1996 | Hattori | 385/88 |
| 5,578,869 A | * | 11/1996 | Hoffman et al. | 257/691 |
| 5,616,886 A | * | 4/1997 | Romero et al. | 174/52.4 |
| 5,834,842 A | * | 11/1998 | Majumdar et al. | 257/718 |
| 5,913,108 A | | 6/1999 | Stephens et al. | 438/109 |
| 6,256,200 B1 | * | 7/2001 | Lam et al. | 361/704 |
| 6,299,056 B1 | * | 10/2001 | Oota | 228/177 |
| 6,306,680 B1 | * | 10/2001 | Fillion et al. | 438/106 |
| 6,307,871 B1 | * | 10/2001 | Heberle | 372/34 |

FOREIGN PATENT DOCUMENTS

| | | | |
|---|---|---|---|
| EP | 0973237 A1 | | 1/1998 |
| JP | 59208788 A | * | 11/1984 |
| JP | 59211252 A | * | 11/1984 |
| JP | 61067971 A | * | 4/1986 |
| JP | 2177583 | | 12/1988 |
| JP | 2-306681 | | 12/1990 |
| JP | 5037089 A | | 7/1991 |
| JP | 8-228044 | | 9/1996 |
| JP | 8-228045 | | 9/1996 |
| JP | 11-340581 | | 12/1999 |
| JP | 284704 A | | 3/2000 |

* cited by examiner

*Primary Examiner*—Bradley Baumeister
*Assistant Examiner*—Chris C. Chu
(74) *Attorney, Agent, or Firm*—Westerman, Hattori, Daniels & Adrian, LLP (57) ABSTRACT

The present invention discloses a semiconductor light emitting device comprising at least one semiconductor light emitting element of edge-emission type, a first heat sink and a second heat sink, wherein at least a part of an electrode for the first-conduction-type semiconductor of the semiconductor light emitting element is in contact with the first heat sink; at least a part of an electrode for the second-conduction-type semiconductor of the semiconductor light emitting element is in contact with the second heat sink; and the first heat sink and the second heat sink are in contact with each other in a junction overlooking one of the two side planes which do not compose the facets of the cavity in the semiconductor light emitting element. The semiconductor light emitting device of the present invention is characterized by having excellent heat spreading, allowing easy and reproducible assembling even if the components or the element composing the semiconductor light emitting device have dimensional errors, and allowing simple optical coupling with an optical fiber or the like.

16 Claims, 7 Drawing Sheets

SEMICONDUCTOR LIGHT EMITTING DEVICE

TECHNICAL FIELD

The present invention relates to a semiconductor light emitting device containing a semiconductor light emitting element, in particular a semiconductor laser diode. The present invention can be successfully adopted in applications where an excellent heat spreading ability of the semiconductor light emitting element is an important characteristic, for example in an excitation light source for optical fiber amplifiers and a light source for optical information processing in which high output and high reliability must be ensured. The present invention is also suitable for the cases where easy attainment of both of excellent heat spreading ability of the semiconductor light emitting element and direct coupling of this with an optical fiber is desired.

RELATED ART

Remarkable progress has been made in recent technologies in optical information processing and optical fiber communication.

For example, in the communication field, extensive research efforts are directed to large-capacity optical fiber transmission and an optical fiber amplifier doped with a rare earth ion such as $Er^{3+}$ (EDFA), which is expected to have the flexibility as a signal amplifier needed for a multi-terabit transmission system. Thus the development of a high-efficiency semiconductor laser diode for an excitation light source, indispensable as an EDFA component, is greatly anticipated.

An excitation light source for EDFA may, in principle, have three possible oscillation wavelengths: 800 nm, 980 nm and 1480 nm. It is known that due to the characteristics of this amplifier the excitation at 980 nm is the best with regard to gain and noise. For a laser diode of excitation light source oscillating at 980 nm, there are conflicting requirements for high output and for long life. In the wavelength range around 980 nm, there is strong needs for development of new laser diodes excellent in output power and reliability, since for example expected applications in the 890 to 1150 nm range include SHG (secondary harmonic generation) light sources, heat source for laser printers, and excitation light sources for optical fiber amplifier such as a state-of-the-art TDFA (thulium-doped fiber amplifier).

In the field of information processing, recent trends prefer higher output and shorter wavelength semiconductor laser diodes in order to achieve higher density storage and faster read/write operation. There is a strong need for higher output from conventional laser diodes (simply referred to as "LD", hereinafter) having an oscillation wavelength of 780 nm, and extensive research on an LD capable of emitting light of 630 to 680 nm is being carried out from every aspect.

As for semiconductor laser diode of a 980-nm range, extensive research has been done and has resulted in practical achievement such as used in a large-capacity submarine cable systems for optical communication between Japan and the US. The reliability thereof, however, is still not satisfactory since rapid degradation may occur in the operation at higher output levels. The same applies to LD's operating at a 780-nm range and 630- to 680-nm range.

One possible cause for poor reliability is thermal influence. Even high-efficiency models of foregoing semiconductor laser diodes can convert input electric power into light only at an efficiency of about 50%, with the rest of the electric power input lost as heat. This means that in cases where particularly high output is desired, the heat generated in semiconductor laser diode will result in remarkably declined maximum light output, degraded laser efficiency and degraded linearity in current-versus-light output characteristics. It is feared that unless there is adequate heat radiation during high-power operation, reliability will be degraded.

generally, in semiconductor laser diodes, heat spreading is ensured by soldering one electrode plane of the laser diode to a heat sink called "sub-mount" which is typically made of AlN or Si. In this specification, an integrated structure comprising a semiconductor light emitting element (for instance LD) and the sub-mount functioning as a heat sink will be referred to as COS (chip on sub-mount), hereinafter. Also in this specification, any structure comprising a semiconductor light emitting element to which is added at least a heat spreading function will be described as a semiconductor light emitting device. The foregoing COS is therefore one kind of semiconductor light emitting device and can be incorporated into a can package or a butterfly package. Such packages are semiconductor light emitting devices with additional functions.

For fabrication of can packages, it is a general practice that a COS is mounted on a so-called "stem" providing further heat spreading and current injection, wirings necessary for the current injection are done, and a cap with a window seals in e.g. a nitrogen atmosphere, to thereby complete a semiconductor light emitting device. On the other hand, butterfly packages can be constructed by mounting a COS on a so-called "OSA (optical sub-assembly)" providing heat spreading and integrating a plurality of parts including a photo diode (PD) and then optically coupling the semiconductor light emitting element with an optical fiber etc., thereby completing the semiconductor light emitting device.

In these two cases, a semiconductor light emitting element is generally brought into contact for heat spreading only on one plane of electrode. A structure allowing the substrate side of the semiconductor light emitting element to contact with the heat sink is called "junction-up (face-up)"; and a structure allowing the epitaxial layer side of the element to contact with the heat sink is called "junction-down (face-down)".

The junction-up mounting is simple and widely practiced since the method allows the light emission point of the element to be removed from the heat sink, i.e. the sub-mount, approximately by the thickness of the element. The method is, however, disadvantageous in terms of heat spreading since the light emission portion of the element is located distant from the heat sink, and so is not always suitable for high-power operation of the semiconductor light emitting element such as the semiconductor laser diode.

On the other hand, the junction-down mounting is advantageous in term of the heat spreading, but still the heat spreading is insufficient, and improvement of this is now urgently required.

Several proposals have been made for the further improvement in heat spreading of the semiconductor light emitting element, and more specifically, semiconductor laser diode. For example, Japanese Laid-Open Patent Publication No. 306681/1990 discloses a method of ensuring heat spreading of the semiconductor laser diode simultaneously in the upper and lower directions. Similar methods are also found in Japanese Laid-Open Patent Publication Nos. 228044/1996 and 228045/1996. It is, however, difficult to fabricate the disclosed structure with an excellent reproducibility by any of these methods.

This is because there is no consideration at all given to dimensional errors generally found in the individual components, typically error in the thickness of the semiconductor light emitting element, or dimensional error of the heat sink sandwiching the semiconductor light emitting element.

In a general fabrication of the semiconductor laser diode, a substrate of as thick as approximately 350 $\mu$m is used to thereby ensure mechanical strength sufficient for executing necessary processes, and the substrate is later polished to reduce the thickness thereof to as thin as 100 to 150 $\mu$m before the n-electrode forming process or cleavage process in order to facilitate the cleavage. It is, however, quite natural that the dimensional error in the thickness as much as 5 to 15 $\mu$m is produced, which causes further error in elements. Process errors can occur also in metal components for heat spreading described in the foregoing Japanese Laid-Open Patent Publication No. 306681/1990; and recessed heat spreading components described in Japanese Laid-Open Patent Publication Nos. 228044/1996 and 228045/1996. Thus fabricating such structures disclosed in these patent applications with good reproducibility will entail a great difficulties when errors in the assembly are taken into account.

Joining by any means necessary the heat spreading component with the semiconductor light emitting element under such unstable conditions may produce strain in both due to the dimensional error and may adversely affect the reliability characteristics of the element to a large extent.

Japanese Laid-Open Patent Publication No. 340581/1999 discloses another method which is designed to ensure heat spreading upward and downward, taking reproducibility in the assembly and practicability into account. Since a laser diode is provided on the rear facet thereof with a spacer layer for controlling the level of the light emission plane, the method is successful in providing the upward and downward heat radiation mechanism in a precise manner. This is, however, disadvantageous in that it makes impossible monitoring of the light, which is generally done from the rear facet, since the spacer shadows that rear facet.

Generally constitution of the package of the semiconductor light emitting element incorporates a photo diode where a slight amount of light emitted from its rear facet is converted into electric current so as to control or monitor the light emitted from the front facet. The method disclosed in Japanese Laid-Open Patent Publication No. 340581/1999 inevitably presents the problem that such function can no longer be carried out.

Another problem resides in that, in any of these methods, direct optical coupling of the laser diode and an optical fiber can be done only when a high level of precision is ensured for the mounting of the semiconductor laser diode, in particular with the sub-mount which is mounted on the light emission point side. The optical fiber and the semiconductor laser diode must be kept with in a distance of 2 to 3 $\mu$m in their direct optical coupling, which means that the semiconductor laser diode must be mounted on the end face of the sub-mount with an equivalent precision. If the front facet of the semiconductor laser diode is removed from the end face to the rear of the sub-mount by more than 2 to 3 $\mu$m, sub-mount end face physically presents the end of the optical fiber from being connected at the local point. On the contrary, if the front facet of the semiconductor laser diode is positioned to the forward of the edge of the sub-mount, heat generated from the semiconductor laser diode cannot be absorbed by the sub-mount, which will have serious impact on the reliability of the element.

Considering the foregoing problems in the prior art, it is therefore an object of the present invention to provide a semiconductor light emitting device which ensures excellent heat spreading function of a semiconductor light emitting element, allowing simple and highly reproducible assembly of components and elements composing the semiconductor light emitting device even if such components and elements have intrinsic dimensional errors, and allowing simple optical coupling with an optical fiber.

SUMMARY OF THE INVENTION

The present inventors found out after extensive investigational efforts that an excellent semiconductor light emitting device showing desired effects can be obtained by sandwiching a semiconductor light emitting element with two heat sinks from the top and bottom to thereby limit the joining of both heat sinks within a specific space.

That is, the present invention is to provide a semiconductor light emitting device comprising at least one semiconductor light emitting element of edge-emission type, a first heat sink and a second heat sink, wherein at least a part of an electrode for first-conduction-type semiconductor of the semiconductor light emitting element is in contact with the first heat sink; at least a part of an electrode for the second-conduction-type semiconductor of the semiconductor light emitting element is in contact with the second heat sink; and the first heat sink and the second heat sink are in contact with each other in a junction overlooking one of the two side planes which do not compose facets of the cavity of the semiconductor light emitting element.

Preferable embodiments of the present invention include such that a portion of the electrode for the first-conduction-type semiconductor of the semiconductor light emitting element is not in contact with the first heat sink in the vicinity of the front facet of the element, and a portion of the electrode for the second-conduction-type semiconductor of the semiconductor light emitting element is in contact with the second heat sink in the vicinity of the front facet of the element; such that the plane of the first heat sink which is kept in contact with the semiconductor light emitting element has an effective electro-conductivity with at least one plane which is not kept in contact with the semiconductor light emitting element; such that the plane of the second heat sink which is kept in contact with the semiconductor light emitting element has no electro-conductivity with any planes which are not kept in contact with the semiconductor light emitting element; such that the diameter of a lead wire for introducing electric current to the semiconductor light emitting element and which is kept in contact with at least one of the group consisting of semiconductor light emitting element, the first heat sink and the second heat sink is 35 $\mu$m or less, and a pair of portions not connected directly with each other are connected with each other with a plurality of lead wires; such that a space is provided in the vicinity of the junction of the first heat sink and the second heat sink, into which an adhesive used for joining such first heat sink and the second heat sink can flow to thereby prevent such adhesive from reaching the semiconductor light emitting element; such that at least a part of the electrode for the first-conduction-type semiconductor is in contact with the first heat sink as being interposed with a first adhesive, at least a part of the first heat sink is in contact with the second heat sink as being interposed with a second adhesive, and the total weight of the second adhesive is twice or above, and more preferably five times or above, heavier than the total weight of the first adhesive; such that at least one of the electrodes of the semiconductor light emitting element has an Au layer having a thickness of 30 to 100 nm; such that the first conduction type is p-type, and the second conduction type is n-type; such that the semiconductor light emitting element is a semiconductor laser diode, and the front facet thereof is provided with an optical fiber so as to compose a semiconductor laser module; and such that the tip of the optical fiber has a light focusing function, and is processed so as to be coupled directly with the front facet of the semiconductor laser diode.

BRIEF DESCRIPTION OF THE DRAWINGS

The above and other objects and features of the invention are apparent to those skilled in the art from the following referred embodiments thereof when considered in conjunction with the accompanied drawings, in which.

DETAILED DESCRIPTION OF THE INVENTION

The semiconductor light emitting device of the present invention will be detailed hereinafter. It should be noted that description of a numeral range by two numerals placed before and after "to" indicates minimum and maximum values.

The semiconductor light emitting device of the present invention means, as described in the above, a device including a semiconductor light emitting element to which is added at least a heat spreading function. In this context, the foregoing COS is one type of semiconductor light emitting device. The semiconductor light emitting device also adds to such COS to which is thermal, mechanical, electrical and optical functions such as heat spreading, temperature stabilization, current injection, sealing, monitoring of light output, wavelength stabilization, wavelength selection, multiplexing, demultiplexing, and fiber coupling; for example by assembling in a so-called can package in which to the COS containing a semiconductor light emitting element is added wiring for enabling current injection and which is encapsulated to thereby ensure air-tightness, or assembling as a light emitting module having a function of optical coupling of the semiconductor light emitting element in the COS and the optical fiber. The semiconductor light emitting device further includes a functional complex of such devices individually having such functions, for example a module comprising a plurality of modules coupled with each other. The so-called optical pick-up is also included in the category of the semiconductor light emitting device.

On the other hand, a semiconductor light emitting element can be any edge-emission type element provided that it comprises semiconductor materials having two conduction types and electrodes attached thereto, there being no special limitation on the materials composing such device, structure, and light emission mechanism. In this specification, a word "semiconductor light emitting element" is synonymous with "light emitting element", which includes light emitting diodes, super luminescent diodes and semiconductor laser diodes. The element may be not only such types that have a single light emission point per one element, but also can be a multi-emitter having a plurality of light emission points per element, or a laser bar having a plurality of elements aligned in a bar form.

The semiconductor light emitting device of the present invention comprises at least one semiconductor light emitting element of edge-emission type, a first heat sink and a second heat sink; and is characterized in that at least a part of an electrode for the first-conduction-type semiconductor of the semiconductor light emitting element is in contact with the first heat sink, at least a part of an electrode for the second-conduction-type semiconductor of the semiconductor light emitting element is in contact with the second heat sink, and the first heat sink and the second heat sink are in contact with each other in a junction overlooking one of the two side planes which do not compose the facets of a the cavity in the semiconductor light emitting element.

There is no special limitation on the structure of the semiconductor light emitting device of the present invention so far as the above conditions are satisfied. The semiconductor light emitting device can thus include any components other than the semiconductor light emitting element, first heat sink, and second heat sink.

The words "contact" or "joining" used in this specification covers any condition such that the semiconductor light emitting element and heat sinks are brought into direct contact without being interposed with any other components, such that the semiconductor light emitting element and heat sinks are joined while being interposed with an adhesive so as to attain a thermally preferable joining, and such that the semiconductor light emitting element and heat sinks are functionally contacted with each other, although direct contact is not achieved, which is typified by the case where adhesive layer is relatively thick. The heat sinks may sometimes be covered with a metal, and thus may result in a boundary structure of heat sink material/covering metal/solder material/covering metal/heat sink material. Such status is also expressed as "the heat sinks contact with each other".

The word "adhesive" in this specification includes all adhesive materials capable of joining the semiconductor light emitting element and the heat sinks. The adhesive available in the present invention necessarily has heat conductivity so as to allow heat generated from the semiconductor light emitting element to be spreaded to the heat sinks. While the following description deals with an exemplary case of a metal-based solder as a preferable representative, the adhesive available in the present invention is by no means limited to such solder.

Figure 1:
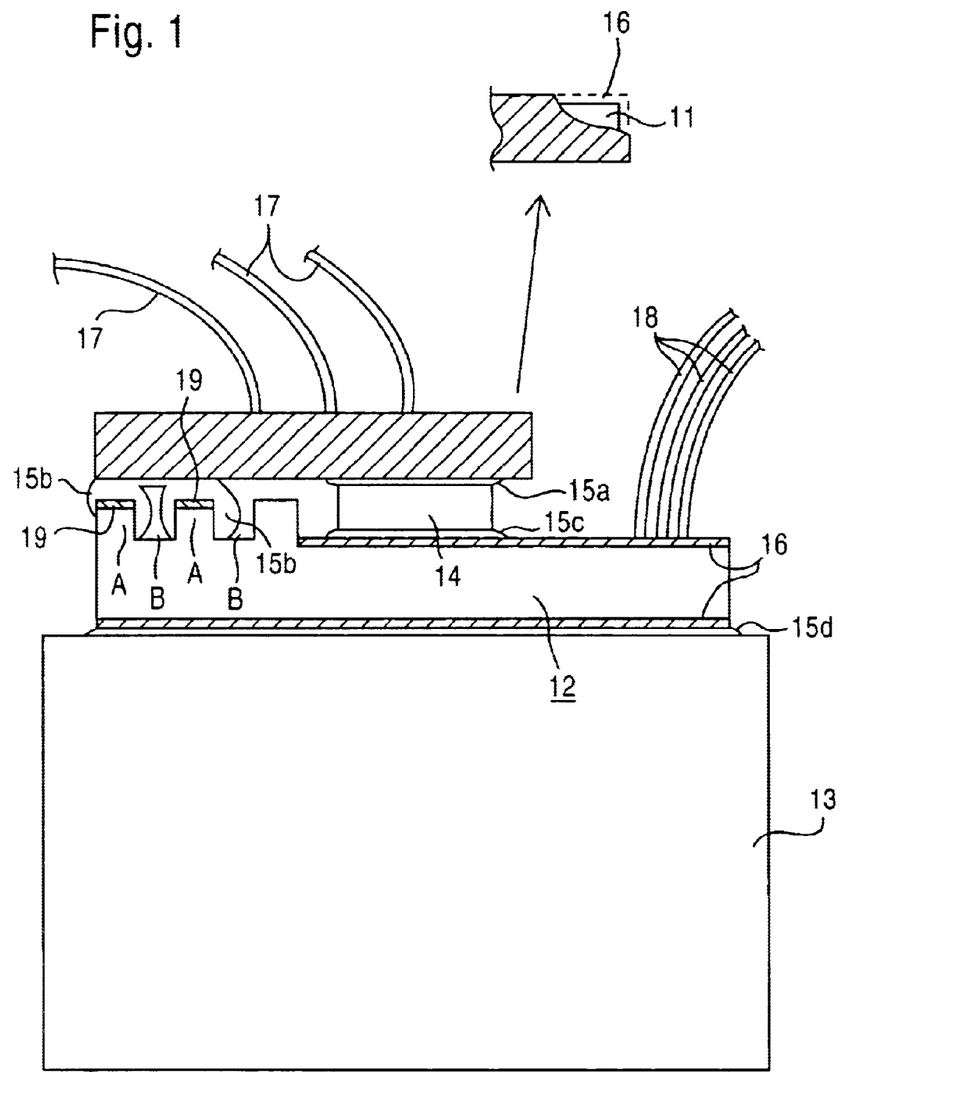
FIG. 1 is a schematic drawing of one embodiment of a semiconductor light emitting device of the present invention as viewed from the direction of the light emission.
Figure 2:
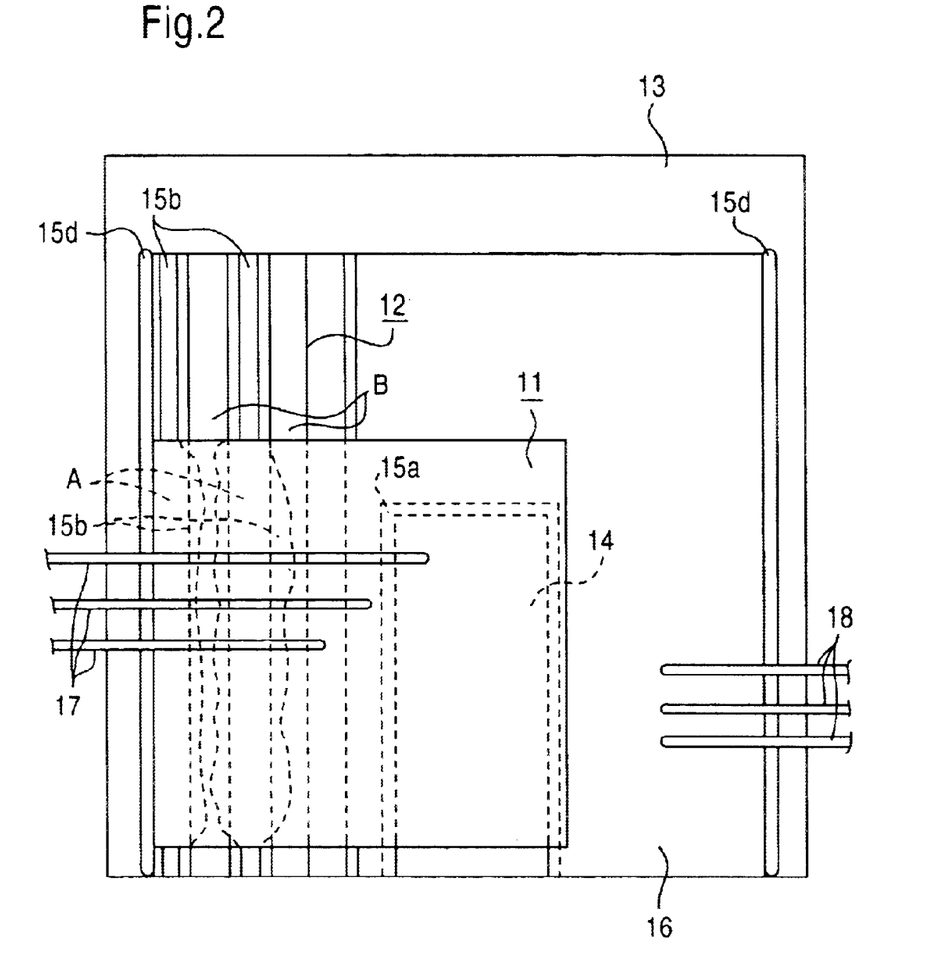
FIG. 2 is a schematic drawing of one embodiment of the semiconductor light emitting device of the present invention shown in FIG. 1 as viewed from the side of an electrode for the first-conduction-type semiconductor.

A preferable example of the constitution and the fabrication process will specifically be described below. An exemplary semiconductor light emitting device of the present invention is shown FIGS. 1 and 2. FIG. 1 shows the light emitting element as viewed from the direction of the light emission, and FIG. 2 shows the same one as viewed from the side of the electrode for the first-conduction-type semiconductor.

Figure 4:
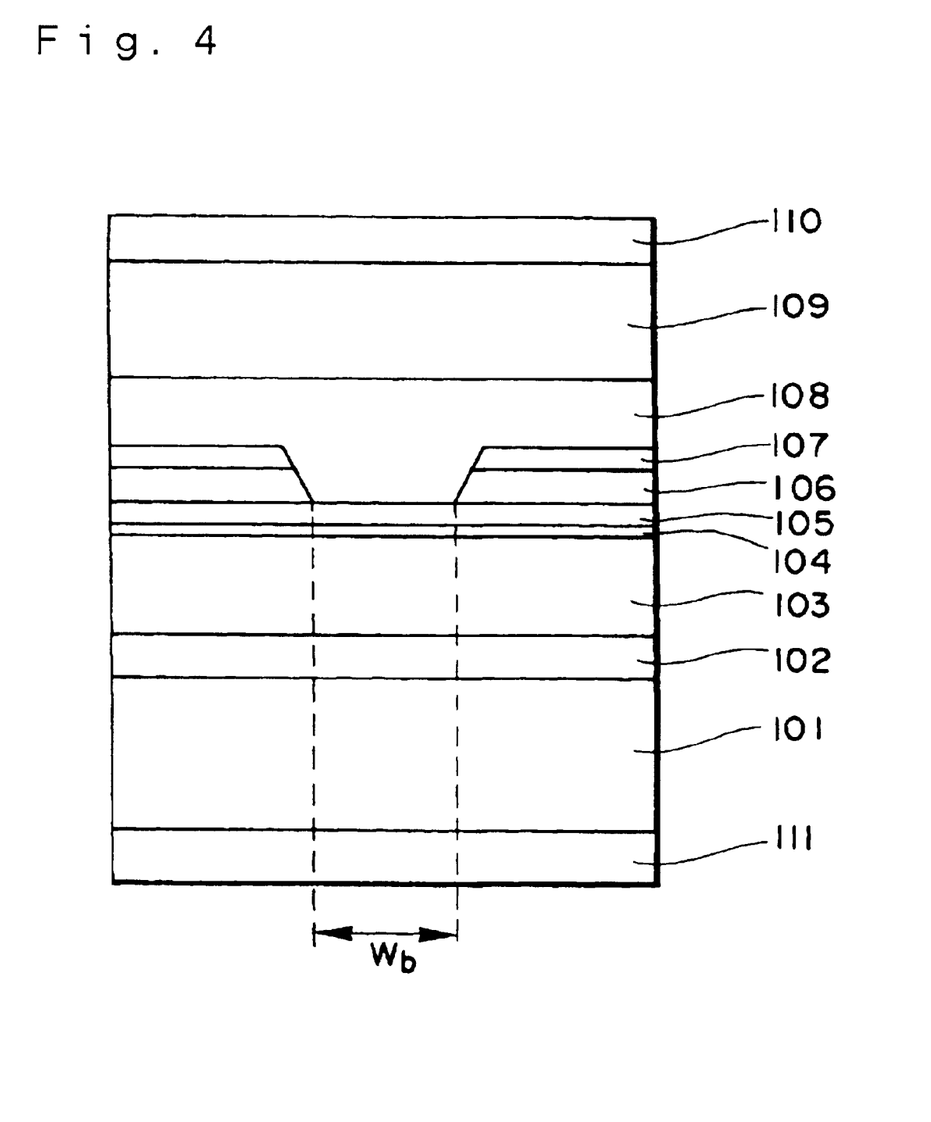
FIG. 4 is a schematic sectional view showing one embodiment of the compound semiconductor light emitting device of the present invention.

An example of the semiconductor light emitting element contained in the semiconductor light emitting device of the present invention is also shown in FIG. 4. The semiconductor light emitting element is a semiconductor laser diode which is formed on a semiconductor substrate, has an index guided structure, has a second-conduction-type clad layer further comprising two layers, has a current injection area comprising a second-conduction-type clad layer and a current blocking layer, and has a contact layer responsible for reducing contact resistance with an electrode.

FIG. 4 is a schematic sectional view showing a constitution of a groove-type semiconductor light emitting element as one example of an epitaxial structure in the semiconductor light emitting element according to a preferable embodiment of the present invention. In such exemplary constitution of the semiconductor light emitting element, a buffer layer 102, a first-conduction-type clad layer 103, an active layer 104 and a second-conduction-type first clad layer 105 are stacked on a substrate 101 made of a chemical compound semiconductor, and further stacked thereon are a current blocking layer 106 having a stripe-formed opening and a cap layer 107. Further thereon a second-conduction-type second clad layer 108 is formed so as to fill the opening of the current blocking layer 106 and to extend over such current blocking layer 106, and a contact layer 109 is formed on such second-conduction-type second clad layer 108. The top and bottom planes of such stack of the compound semiconductor layers have formed thereon electrodes 110 and 111, respectively.

It should now be noted that in this specification, the expression "layer B formed on layer A" include both cases where layer B is formed so that the bottom plane thereof comes into contact with the top plane of layer A, and such that one or more layers are formed on the top plane of layer A, and further thereon layer B is formed. The above expression further includes a case in which the top plane of layer A and the bottom plane of layer B partially come into contact and have one or more layers interposed in other areas. Specific embodiments will be apparent from the description of the individual layers and specific Examples. The specification also employs Roman numerals for expressing group of elements, which complies the conventional notation.

In FIG. 4, the substrate 101 composing the semiconductor light emitting element of the present invention is not specifically limited in terms of the electro-conductivity or raw materials so long as the double-hetero-structured crystals can be grown thereon. Preferable is an electro-conductive substrate.

More specifically, the substrate 101 is preferably made of a single-crystalline substrate made of InP, GaAs, GaN, InGaAs or the like the material chosen in consideration of the desired oscillation wavelength, lattice matching property, strain intentionally introduced into the active layer, and compensation of strain in the active layer used in the guide layer. Even a substrate 101 comprising a dielectric such as $Al_2O_3$ is included in the embodiment of the present invention, since upon this substrate will grow semiconductor crystal layers. Dielectric substrates such as those made of $Al_2O_3$ are also as the substrate The substrate 101 is preferably an InP substrate or GaAs substrate in view of lattice matching in III–V compound semiconductor light emitting element containing As, P etc. as a group V element. When As is contained as a group V element, the substrate 101 is more preferably a GaAs substrate.

Further, among various III–V compound semiconductor light emitting elements, those containing nitrogen as a group V element can be used where the substrate 101 comprises a dielectric such as $Al_2O_3$.

Not only so-called just-oriented substrate, but also so-called off-oriented (miss oriented) substrate is usable as the substrate 101 in view of improving the crystallinity during the epitaxial growth. The off-oriented substrate is widely used since it can enhance favorable crystal growth in the step flow mode. While the off-oriented substrates widely used in general are those having an angle of inclination of approximately 0.5 to 2°, those inclined at 10° or around are also usable depending on the material system composing the quantum well structure.

The substrate 101 may previously be subjected to chemical etching or annealing as preparation for the fabrication of the semiconductor light emitting element based on crystal growth technologies such as MBE and MOCVD.

The thickness of the substrate 101 is generally about 350 $\mu$m, which can ensure necessary mechanical strength in the fabrication process of the semiconductor light emitting element. The substrate 101 is thinly polished midway in the process in order to form the facet of the semiconductor light emitting element.

The buffer layer 102 is preferably provided so as to alleriate incompleteness in the substrate bulk crystal, and to facilitate the growth of epitaxial film along the identical crystal axis. The buffer layer 102 is preferably made of a material which is the same as that used for the substrate 101. That is, if the substrate 101 is made of GaAs, GaAs is usable. However in some cases, the same materials are not used since it has become also popular to use a super-lattice layer for the buffer layer 102. On the other hand, for the case that the substrate 101 is dielectric one, it is not always necessary to use the same material for such substrate, and the material can properly be selected based on the desired emission wavelength and the entire structure of the device.

The thickness of the buffer layer 102 is preferably 0.1 to 3 $\mu$m.

The first-conduction-type clad layer 103 is generally made of a material having a refractive index smaller than the average refractive index of the active layer 104. The material used for the first-conduction-type clad layer 103 can properly be selected based on the materials used for the substrate 101, buffer layer 102 and active layer 104 which are selected to realize the desired oscillation wavelength. For example for the case that the substrate 101 is made of GaAs and the buffer layer 102 is again made of GaAs, the first-conduction-type clad layer 103 can typically be made of AlGaAs-base material, InGaAs-base material, AlGaInP-base material or InGaP-base material. The entire portion of the first-conduction-type clad layer 103 can have a super-lattice structure.

While an exemplary case shown in FIG. 4 has a single first-conduction-type clad layer 103, such first-conductiontype clad layer 103 may also be made of a plurality of layers. The thickness of the first-conduction-type clad layer 103 is preferably 0.05 to 3.5 μm.

The lower limit of the carrier concentration of the first-conduction-type clad layer 103 is preferably $1\times10^{17}$ cm$^{-3}$ or above, and more preferably $3\times10^{17}$ cm$^{-3}$ or above, and most preferably $5\times10^{17}$ cm$^{-3}$ or above. The upper limit thereof is preferably $2\times10^{20}$ cm$^{-3}$ or below, and more preferably $2\times10^{19}$ cm$^{-3}$ or below, and most preferably $5\times10^{18}$ cm$^{-3}$ or below.

Improvement in the heat spreading characteristics of the semiconductor light emitting device of the present invention can be confirmed for any conduction types, materials and structures of the active layer 104, where preferable materials therefor include those containing In and/or Ga, and particularly those including In. The most preferable material is that containing both In and Ga. The active layer 104 containing both In and Ga will be most promising when applied to various applications, since it is supposed that a wavelength range attained by such material can most successfully meet conflicting requirements for reliability and high output. It can thus be strongly expected that such improvement in the heat spreading property of the semiconductor light emitting device of the present invention will result in improved characteristics of the semiconductor light emitting element of the present invention.

From such point of view, the material used for the active layer 104 is preferably AlGaAs, InGaAs, InGaP, AlGaInP, AlInGaAs, InGaAsP and GaAsP, wherein it is preferable that $In_xGa_{1-x}As$ ($0\leq x\leq 1$) or $(Al_xGa_{1-x})_yIn_{1-y}P$ ($0\leq x\leq 1$, $0\leq y\leq 1$). To obtain a high output laser diode, it is particularly preferable for the active layer 104 to have a quantum well structure. Material for composing the quantum well structure can properly be selected based on the desired oscillation wavelength.

The active layer 104 may have a structure of a usual single-layered bulk active layer, or may have any quantum well structure such as single quantum well (SQW), double quantum well (DQW) and multiple quantum well (MQW), selected based on the desired oscillation wavelength. The quantum well structure generally includes an optical guide layer, and also includes a barrier layer as necessary. Possible structures for the active layer 104 include those having on both ends thereof optical guide layers (SCH structure), and those having refractive index continuously graded due to gradual compositional changes within the optical guide layer (GRIN-SCH structure) It is also preferable to employ distorted quantum well structure in order to improve laser characteristics. It is still also allowable to select a material of the optical guide layer so as to have a strain reverse to that in the quantum well layer, to thereby cancel the strain of the active layer 104 as a whole.

The thickness of the active layer 104 is preferably 0.5 to 20 nm per layer for the case of having the quantum well structure.

Materials for the optical guide layer include GaAs, AlGaAs, InGaAs, InGaP, AlGaInP, AlInGaAs, InGaAsP and GaAsP, which can properly be selected based on the material composing the active layer 104. It is also allowable to apply super-lattice structure to the optical guide based on combinations of such materials. It is still also allowable to intentionally insert a material having a large band gap between the quantum well layer and optical guide layer to thereby improve the temperature characteristics.

On the active layer 104, the second-conduction-type clad layer is formed. In the present invention, the second-conduction-type clad layer is formed in two layers or more. The following description deals with an exemplary case having two layers, a second-conduction-type first clad layer 105 and a second-conduction-type second clad layer 108, in order starting from the active layer 104.

The second-conduction-type first clad layer 105 is generally made of a material having a refractive index smaller than that of the active layer 104. The material used for the second-conduction-type first clad layer 105 can properly be selected based on the materials used for the substrate 101, buffer layer 102 and active layer 104 which are selected for a desired oscillation wavelength. For example for the case that the substrate 101 is made of GaAs and the buffer layer 102 is also made of GaAs, the second-conduction-type first clad layer 105 can typically be made of AlGaAs, InGaAs, InGaP, AlGaInP, AlInGaAs, InGaAsP and GaAsP.

The lower limit of the carrier concentration of the second-conduction-type first clad layer 105 is preferably $1\times10^{17}$ cm$^{-3}$ or above, more preferably $3\times10^{17}$ cm$^{-3}$ or above, and most preferably $5\times10^{17}$ cm$^{-3}$ or above. The upper limit thereof is preferably $5\times10^{18}$ cm$^{-3}$ or below, and more preferably $3\times10^{18}$ cm$^{-3}$ or below, and most preferably $2\times10^{18}$ cm$^{-3}$ or below. The lower limit of the thickness is preferably 0.01 μm or above, more preferably 0.05 μm or above, and most preferably 0.07 μm or above. The upper limit thereof is preferably 0.5 μm or below, more preferably 0.4 μm or below, and most preferably 0.2 μm or below.

It is necessary for the current blocking layer 106 to block electric current injected from the electrode so as to substantially prevent such electric current from flowing towards the lower layers. Thus it is preferable that the current blocking layer has a conduction type which is the same as that of the first-conduction-type clad layer 103 or which is un-doped.

There is no special limitation on the thickness of the current blocking layer 106 as long as it can block the current to thereby successfully prevent such current from flowing towards the lower layers. The thickness of the current blocking layer 106 is preferably 0.1 to 2 μm.

For the case that the current blocking layer 106 is made of AlGaAs, the refractive index of the current blocking layer 106 is preferably smaller than that of the second-conduction-type second clad layer 108 made of $Al_yGa_{1-y}As$ ($0<y\leq 1$). When the current blocking layer 106 is made of $Al_zGa_{1-z}As$ ($0\leq z\leq 1$), the Al concentration preferably satisfies the relation z>y.

The current blocking layer 106 may also comprise two or more layers differing from each other in the refractive indices, carrier concentrations or conduction types in order to control light distribution (in particular in the lateral direction) and improve current blocking function. On such current blocking layer 106, the cap layer 107, which will be described next, can be formed to thereby suppress surface oxidation and provide surface protection during the process.

The cap layer 107 is used as a protective layer for the current blocking layer 106 during the first epitaxial growth, and is also used to facilitate the growth of the second-conduction-type second clad layer 108. While the conduction type of the cap layer 107 is not specifically limited, selecting a first conduction type will improve the current blocking function.

The cap layer 107 is removed partially or entirely before the final semiconductor light emitting structure is obtained.

The second-conduction-type second clad layer 108 is formed on the first-conduction-type clad layer 105 and the cap layer 107. The second-conduction-type second clad layer 108 is formed so as to entirely close the aperture of the openings formed between the stripes of the current blocking layer 106, and so as to be an extension of such stripes of the current blocking layer 106 located on both sides of the openings.

The lower limit of the carrier concentration of the second-conduction-type second clad layer 108 is preferably $5 \times 10^{17}$ cm$^{-3}$ or above, more preferably $7 \times 10^{17}$ cm$^{-3}$ or above, and most preferably $9 \times 10^{17}$ cm$^{-3}$ or above. The upper limit thereof is preferably $1 \times 10^{19}$ cm$^{-3}$ or below, more preferably $5 \times 10^{13}$ cm$^{-3}$ or below, and most preferably $3 \times 10^{18}$ cm$^{-3}$ or below.

The thickness of the second-conduction-type second clad layer 108 is preferably 0.5 μm or above, and at most 3.5 μm. Too thin a layer results in insufficient confinement of the light, and too thick a layer results in increased series resistance. The refractive index of the second-conduction-type second clad layer 108 is generally smaller than that of the active layer 104.

The second-conduction-type second clad layer 108 is preferably provided with a contact layer 109 in order to lower contact resistance with an electrode 110. Materials for composing the contact layer 109 is preferably selected from those having smaller band gaps than the clad layers have, and those having low resistance and an appropriate carrier concentration in order to attain ohmic contact with a metal electrode. The lower limit of the carrier concentration is preferably $1 \times 10^{18}$ cm$^{-3}$ or above, more preferably $3 \times 10^{18}$ cm$^{-3}$ or above, and most preferably $5 \times 10^{18}$ cm$^{-3}$ or above. The upper limit thereof is preferably $2 \times 10^{20}$ cm$^{-3}$ or below, more preferably $5 \times 10^{19}$ cm$^{-3}$ or below, and most preferably $2 \times 10^{19}$ cm$^{-3}$ or below. The thickness of the contact layer 109 is preferably 0.1 to 10 μm, more preferably 1 to 8 μm, and still more preferably 2 to 6 μm.

The semiconductor light emitting element according to a preferable embodiment of the present invention is a high-power semiconductor laser diode based on single transverse-mode operation. For this reason the between the current blocking layer 106 and the second-conduction-type second clad layer 108, and the width $W_b$ (see FIG. 4) of the second-conduction-type second clad layer 108 defined by the opening of the current blocking layer 106 are preferably selected so that higher order modes are cut off. A semiconductor laser diode based on the single transverse-mode operation generally yields a light emissive point of several micrometers. Thus it is important to suppress local heat generation for higher performance. From this point of view, the width $W_b$ is preferably 1.0 to 3.0 μm, and the effective difference of refractive index is preferably $1 \times 10^{-3}$ to $1 \times 10^{-2}$.

The semiconductor light emitting element shown in FIG. 4 has the electrode 110 on the upper side of the contact layer 109. For the case that a p-type material is to be used for the electrode 110, such electrode 110 can be formed after Ti, Pt and Au layers are evaporated to from lamination in this order on the surface of the contact layer 109.

After the electrode 110 is formed, the substrate 101 is polished to reduce the thickness thereof to as thin as 100 to 150 μm. Dimensional errors of the thickness in this process stage is preferably suppressed as small as approximately 5 to 15 μm within a single substrate or per one process run of the polishing.

Forming the electrode 111 completes the semiconductor light emitting element. For the case that an n-type material is to be used for the electrode 111, such electrode 111 can be formed after AuGe, Ni and Au layers are evaporated to form lamination in this order on the front surface of the substrate 101 and then subjected to alloying.

When such electrodes are formed, it is preferable to suppress strain possibly generated within the electrode structures in consideration of the joining with the heat sinks which will be described later. The suppression is aimed at preventing the reliability of the element from being degraded, which is possibly caused by extrinsic strain applied in the vicinity of the active layer, which is generated when the heat sinks and the semiconductor light emitting element are joined in particular using a solder material. One possible causes for such strain is attributable to the migration of the uppermost Au electrode layer into the solder material. When AuSn solder is used for example, the Au electrode melts into such solder material and raises the compositional ratio of Au in such solder, which causes the extrinsic strain. This is avoidable by thinning the Au layer which composes the uppermost layer of the electrode, to thereby reduce the amount of the Au electrode that possibly migrates into the solder material and thus suppressing the extrinsic strain.

Absolute absence of the Au layer is, however, detrimental to obtaining sufficient adhesion strength, so that the thickness thereof is preferably thicker that 30 nm and thinner than 100 nm, and more preferably thicker than 50 nm and thinner than 70 nm.

Thus processed semiconductor wafer is then subjected to a process for forming the facets of the cavity. The facets of the cavity can be formed by common process for fabricating semiconductor light emitting element, and is not specifically limited.

One preferable method relates to cleavage of the wafer into a form of so-called laser bar to thereby produce the facets. The cleavage is widely practiced in the production of edge-emission type laser element, and facets thus produced will differ depending on the crystal orientation of the substrate used.

For example, when the elements such as edge-emission type laser element are fabricated using a substrate having a plane crystallographically equivalent to that of a nominally (100) substrate, a (110) plane or a plane crystallographically equivalent thereto will serve as the planes composing the cavity. On the other hand, when an off-oriented substrate is used, the facets may not always normal to the axis of the cavity depending on the relation between the angle of inclination and the axial direction of the cavity. For example, when a substrate inclined by 2° from the (100) plane towards the [1–10] direction is used, the facets will also incline by 2°.

The cleavage also defines the cavity length of the element. In the semiconductor light emitting element according to a preferred embodiment of the present invention, the lower limit of the cavity length is preferably 600 μm or above, and more preferably 900 μm or above. While longer cavity length is more suitable for high-power operation in general, extremely long cavity length may result in degradation of characteristics such as raised threshold current and lowered efficiency. The upper limit of the cavity length is thus preferably selected at 3,000 μm or below.

The semiconductor light emitting element of the present invention preferably has, on the exposed facet of the semiconductor material, a coating comprising a dielectric material or a combination of dielectric and semiconductor materials. The coating is provided mainly for two purposes; that is to raise external differential quantum efficiency of the semiconductor light emitting element, and to ensure facet protection. In particular for the case that high output is desired, asymmetric coating is advantageous, in which a coating with low reflection of the oscillation wavelength is provided on the front facet, and a coating with high reflection of the oscillation wavelength is provided on the rear facet.

Various materials can be employed for the coating. It is preferable to use any one or combination of two or more materials selected from the group consisting of $AlO_x$, $TiO_x$, $SiO_x$, SiN, Si and ZnS. Low-reflection coating preferably uses $AlO_x$, $TiO_x$ or $SiO_x$, and high-reflection coat layer uses multi-layered films of $AlO_x/Si$ or $TiO_x/SiO_x$. A desired reflectivity can be obtained by adjusting the individual film thickness. The film thickness of, for example, $AlO_x$, $TiO_x$ or $SiO_x$, which is suitable for the low-reflection coat layer is preferably adjusted to λ/4n or around, where n represents real number part of the reflectivity at that wavelength λ. Also for the high-reflection, multi-layered film, it is preferable to adjust the individual films contained therein to be about λ/4n in thickness.

After the coating, the laser bar is cleaved again to thereby separate the individual elements, which is the completed form of the element.

There is no special limitation on the production method of the semiconductor light emitting element contained in the semiconductor light emitting device of the present invention. Any elements produced by any methods will be within a scope of the present invention so long as they satisfy the conditions of the present invention.

Any known methods for fabricating the semiconductor light emitting element can properly be selected and used in the present invention. Methods for the crystal growth are also not limitative, and any known growth process can properly be selected and used, where examples of which include metal-organic chemical vapor deposition (MOCVD) method, molecular beam epitaxy (MBE) method, hydride or halide vapor phase epitaxy (VPE) method and liquid phase epitaxy (LPE) method.

In a typical fabrication method of semiconductor light emitting element of the present invention, a double hetero structure comprising the buffer layer 102, first-conduction-type clad layer 103, active layer 104 and second-conduction-type first clad layer 105 are first formed on the substrate 101; further on the second-conduction-type first clad layer 105 the current blocking layer 106 is formed; the current blocking layer 106 is then patterned to have the openings; and the second-conduction-type second clad layer 108, contact layer 109 and electrodes 110, 111 are formed. Japanese Laid-Open Patent Publication No. 130344/1996 is a good reference for various methods of producing basic epitaxial structures for the laser diode, including of course the foregoing exemplary case.

Such kind of laser diode is available as a light source for optical fiber amplifier used for optical communication, and as a pick-up light source for large-scale, magneto-optical memory used for information processing; which is further applicable to various applications by properly selecting the layer constitution, materials and so forth.

The completed semiconductor light emitting element is preferably joined to the heat sinks so as to contact the p-side electrode with the first heat sink, and the n-side electrode with the second heat sink. It is now necessary that the first and second heat sinks partially contact with each other. It is important that such contact is accomplished within a space overlooking one of the two side planes which do not compose the facets of the cavity in the semiconductor light emitting element. The reason therefor will be described below.

In practice, it is substantially impossible to always equalize the height of portion A (see FIG. 1) with the height of the semiconductor light emitting element 14, since an error intrinsically occurs in the height of portion A from the laser mounting plane when the second heat sink is fabricated, and an error is also included in the thickness of every semiconductor light emitting element. Thus in order to allow desirable adhesion and thus ensure good thermal contact between the semiconductor light emitting element 14 and the first and second heat sinks 11, 12 when sandwiching such element 14 between first and second heat sinks 11, 12 a certain mechanism capable of absorbing the error in the thickness amounting to approximately 50 to 100 μm is indispensable in the COS fabrication.

For this, the height of portion A of the second heat sink 12 is intentionally set lower than the predicted height of the semiconductor light emitting element 14, and a solder foil of approximately 20 to 400 μm thickness is placed on such portion A so as to absorb the difference between the heights of the portion A and the element to be mounted on the second heat sink 12. An LD 14 is placed on the second heat sink 12, and the first heat sink 11 is then placed thereon so as to be partially in contact with the solder foil and partially in contact with the electrode portion of the LD 14. In this way the initial state of the mounting is such that the first heat sink 11 is mounted so as to be inclined lower on the LD 14 side when viewed from the direction of the light emission from such LD 14. It is preferable thereafter to join the first heat sink 11, semiconductor light emitting element 14 and second heat sink 12 while applying pressure on the first heat sink 11 and heating the solder foil to allow pressure adhesion.

Joining of the first heat sink 11, semiconductor light emitting element 14 and second heat sink 12 is also attainable by preliminarily joining only the semiconductor light emitting element 14 and second heat sink 12 by contact heating, and thereafter adding the first heat sink 11 thereto.

Now as shown in FIG. 1, by making contact between the first and second heat sinks 11,12 within a space overlooking one of the two side planes which do not compose facets of the cavity in the semiconductor light emitting element 14, it is always ensured that the solder foil, semiconductor light emitting element 14, first heat sink 11 and second heat sink 12 are brought into contact with each other before pressure is applied for example from the top of the first heat sink 11 and the solder material 15, 15a, 15b, 15c, and 15d is heated to melt. This readily cancels the dimensional errors among the individual components and the element, which results in proper contact between the semiconductor light emitting element 14, first heat sink 11 and second heat sink 12.

On the contrary, if both side planes other than those composing the cavity have portions which are brought into contact with the first and second heat sinks 11,12 stable assembly likely cannot be done since there will probably be contact only between the first and second heat sinks 11,12, or between the first heat sink 11 and the semiconductor light emitting element 14.

Such sandwiching of the element with the first and second heat sinks 11,12 and the bringing of such first and second heat sinks into contact with each other in the space overlooking one of the two side planes which do not compose facets of the cavity in the semiconductor light emitting element 14 can facilitate the stable assembly, and can realize the removal of heat simultaneously from both of the p-side of where the epitaxial growth of the semiconductor light emitting element 14 occurred and the n-side facing the substrate. Such constitution is superior to the so-called junction-up or junction-down structure in principle.

While the semiconductor light emitting device of the present invention can allow the heat generated by the semiconductor light emitting element 14 to be removed through two directions since the first and second heat sinks 11,12 are brought into contact with each other, an advantage of the device resides in that the heat can finally be removed through a single direction. For example, heat removed from the p-side using the first heat sink 11 can be conducted to the second heat sink 12 by lowering the thermal potential of such second heat sink 12. This allows heat removed bi-directionally to finally be removed only from the side of the second heat sink 12. This is quite advantageous in that having a consistency compatibility with the variety of offer-used packages of semiconductor light emitting devices designed for one-directional heat removal.

Since the contact between the first and second heat sinks 11,12 is ensured in the space overlooking one of the two side planes which do not compose facets of the cavity in the semiconductor light emitting element 14, the current injection can be effected in the lateral direction relative to the direction of the light emission, so that the device is advantageous also from a viewpoint of ensuring compatibility with a variety of known semiconductor laser packages. Such mounting style of the element is also advantageous in that is improves heat spreading of the element while retaining the monitoring function using a PD, since there is no obstacle on the light path routed from the rear facet of the element.

finally, to attain the one-directional heat spreading in an efficient manner, it is preferable to use a third heat sink 13 on a part of the second heat sink 12 side as shown in FIG. 1. The third heat sink 13 is preferably larger in size than the first and second heat sinks, and more excellent in heat spreading, because such third heat sink 13 can rapidly remove heat conducted from the first and second heat sinks 11,12 to any structure outside the element, which is typically an enclosure. The third heat sink 13 thus preferably contacts with the second heat sink 12 on one side thereof, and with the enclosure or Peltier cooler made of so-called thermo-electric semiconductor on the other side thereof. For the case that the semiconductor light emitting device is intended for use as a semiconductor laser module, the third heat sink 13 may not only function as a heat spreader, but may also provide an area on which a photodiode for monitoring the light output can be mounted together with a COS having an integrated structure of semiconductor laser element 14/first heat sink 11/second heat sink 12, and may even have a positioning function.

According to the structure in which heat from the semiconductor light emitting element 14 can bi-directionally be spread using the first and second heat sinks 11,12, and is then finally spread out from either heat sink by joining both heat sinks, adequate heat spreading is ensured even if either heat sink is not contacted with the semiconductor light emitting element 14 in the vicinity of either electrode thereof as shown in FIG. 2.

Figure 3:
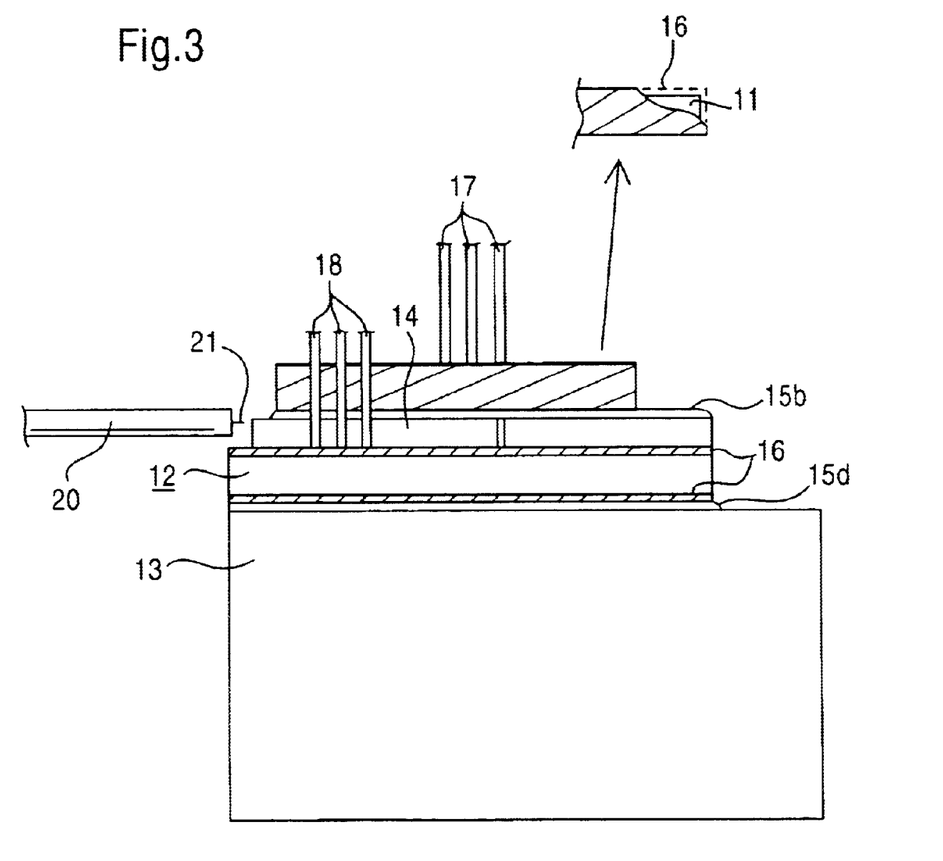
FIG. 3 is a schematic drawing of one embodiment of a semiconductor light emitting device of the present invention illustrated so as to direct the direction of light emission leftward.

This is advantageous in particular for InGaAs-base, high-power semiconductor laser diode fabricated on GaAs substrate, for which desirable heat spreading in the vicinity of the facets and effective coupling with an optical fiber must be ensured at the same time. In a semiconductor laser module which is a typical semiconductor light emitting device employing the semiconductor laser element, the front facet of the semiconductor laser element must be optically coupled with an optical fiber. It is thus desirable that the first heat sink located close to the active layer is positioned so that the edge thereof is recessed from the front facet of the semiconductor laser element as shown in FIG. 3 so as to avoid interference between such heat sink and the fiber tip. Such positioning can ensure desirable heat spreading from the element and simple coupling with the optical fiber. For adequate heat spreading, it is preferable that the edge of the second heat sink 12 is aligned with the front facet of the semiconductor laser element 14, or that the front facet of the semiconductor laser element 14 is slightly recessed. Also for alignment of the optical fiber with the optical axis, the edge of the first heat sink 11 is preferably removed by 15 μm or more from the front facet of the semiconductor laser element 14. It is also preferable that the tip of the optical fiber has a function of a lens so as to effectively receive the light from the front facet of the semiconductor element 14. It should be noted that the direction of the light emission in FIG. 3 is leftward on the drawing.

As described in the above, the semiconductor light emitting element 14, first heat sink 11 and second heat sink 12 are preferably joined with each other in order to ensure sufficient heat spreading, such joining achieved by using an adhesive containing organic substances, and more preferably achieved by using an inorganic adhesive such as metal simple substance or alloy solder. Preferable examples of the solder material include those containing AuGe, AuSn, AgSn, PbSn, InSn, SnBi or In. In particular, AuSn eutectic solder is most suitable for the joining of the semiconductor light emitting element, first heat sink and second heat sink for its excellent stability.

As shown in FIG. 1, there is provided a space in the vicinity of the junction of the first heat sink 11 and the second heat sink 12, into which excess solder material 15b can preferably flow to thereby prevent such adhesive from reaching the semiconductor light emitting element 14. More specifically, it is preferable to provide this space with no passage to the semiconductor light emitting element 14, so that excess solder 15b will flow into this space and there remain.

As described in the above, the thickness of the semiconductor light emitting element and thickness of the heat sink intrinsically are prone to dimensional errors, so that the mounting as illustrated in FIG. 1, in which the semiconductor light emitting element 14, first heat sink 11 and second heat sink 12 are kept in parallel with each other, needs some mechanism by which differences of the thickness among the relevant components can be compensated for, and such relevant components can be integrated. For such purpose, it is beneficial that the thickness of the solder material 15b is intentionally selected to be thick enough to absorb dimensional errors in the individual components, and that a certain space is provided in order to accumulate the excess, solder at a remove from the semiconductor light emitting element 14 so as to keep it contacting with the element. In the embodiment shown in FIG. 1, the solder foil is initially mounted on portion A, which is a part of the second heat sink, and is then melted under heating for the joining of the first heat sink 11, second heat sink 12 and semiconductor light emitting element 14, where a part of the solder foil flows into portion B of the second head sink 12. Such space for accommodating the solder 15b may be recesses in the second heat sink 12, or may be recesses in the first heat sink 11, or maybe recesses in both. While there is no limitation on the shape of the recesses, the shape is preferably such that it allows smooth flow of the solder therein and prevents reverse flow. Providing the recesses at least on a part of the second heat sink 12 is particularly preferable.

While such structural approach of providing for the solder pool is of course effective in preventing contact of the solder with the semiconductor light emitting element 14, it is also allowable to intentionally provide on a part of the heat sink a portion capable of reducing wetting (affinity) of the solder to thereby prevent the solder 15b for joining the first and second heat sinks 11,12 from flowing into the portion where the semiconductor light emitting element 14 is to be mounted.

More specifically, most of the heat sinks are made of ceramic materials, so that the general practice is to provide that wetting (affinity) improving layer comprising a metal layer on the heat sink as shown in FIG. 1, and the solder is mounted on that metal layer. A portion where the ceramic material is exposed to the surface has an extremely low wetting affinity as compared with a portion where a metal layer is exposed. Based on such properties, it thus becomes possible to prevent the solder for joining the first and second heat sinks from flowing into a portion where the semiconductor light emitting element is to be mounted.

Figure 5:
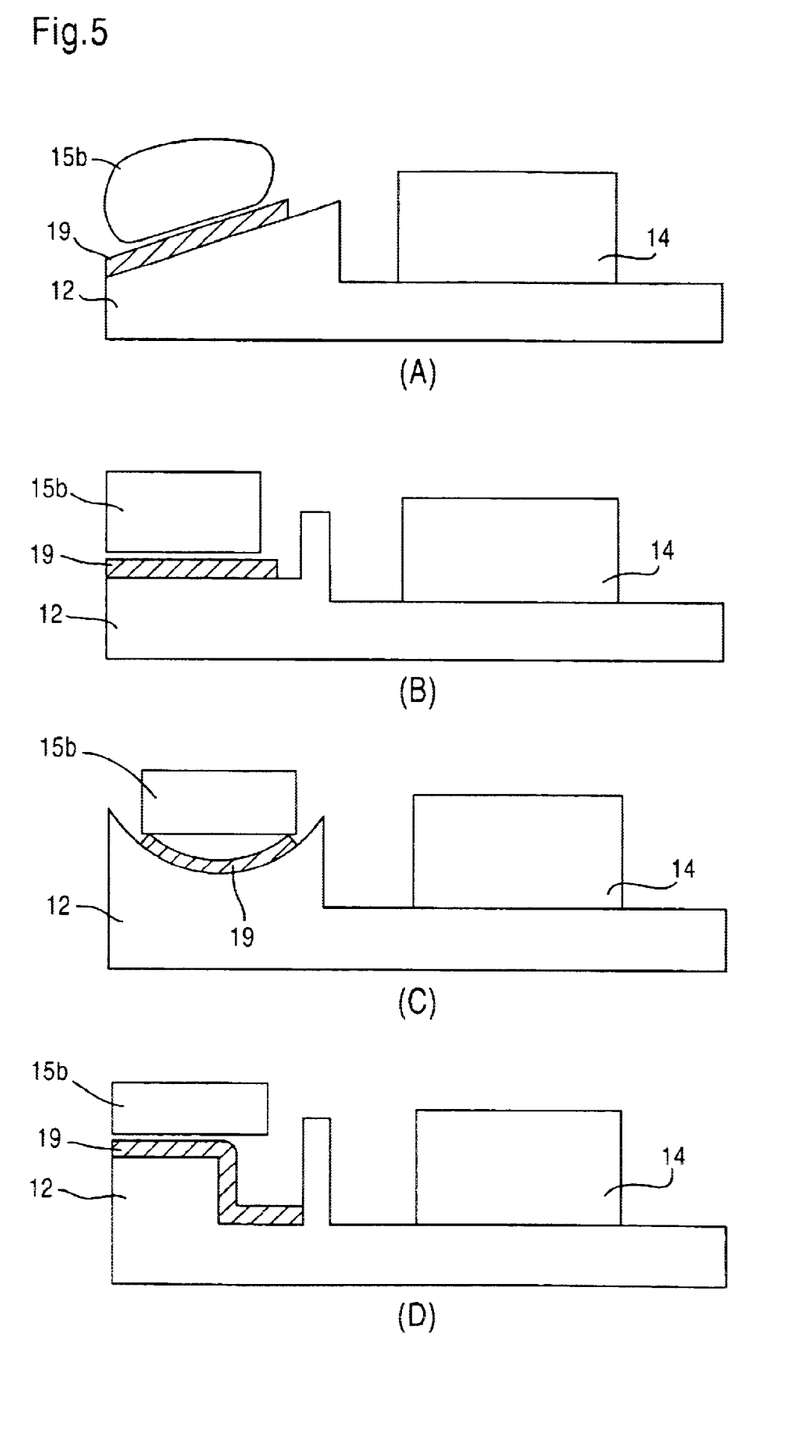
FIGS. 5A to 5D are schematic sectional views showing exemplary second heat sinks having incorporated therein a wetting (affinity) improving layer.

The wetting (affinity) improving layer is located so as to enhance the flow of the excessive solder into the space for accommodating the solder. In particular, it is preferable to locate such layer so that the solder material 15b will surely flow into the space while preventing flow towards the semiconductor light emitting element 14. Specific embodiments threreof can be exemplified as those shown in FIGS. 5A to 5D, other th that shown in FIG. 1. In a structure shown in FIG. 5A, the wetting affinity improving layer is placed on a slope so that the excessive solder material 15b can flow down leftward in the figure. In such case, the wetting (affinity) improving layer is definitely not provided in the vicinity of the top end portion of the slope, which is close to the semiconductor light emitting element 14, so that the solder material 15b will not flow towards the semiconductor light emitting element 14. Also in structures shown in FIGS. 5B to 5C, the device is composed so that the excessive solder material 15b accumulates in a portion where the wetting (affinity) improving layer is formed, or flow over such portion to drop in the solder pool. Such structure may be provided in a plural number per heat sink. In such case, the individual structures may differ from each other.

In the present invention, it is preferable that at least a part of the electrode for the first-conduction-type semiconductor is in contact with the first heat sink as being interposed with a first adhesive 15a (preferably solder material); at least a part of the first heat sink is in contact with the second heat sink interposed with second adhesive 15b (preferably solder material); and the total weight of the second adhesive 15b is twice or more, and more preferably five times or more, heavier than the total weight of the first adhesive 15a. Providing such difference in the weight of the adhesives is advantageous in that facilitating the adjustment of the semiconductor light emitting element, first heat sink and second heat sink, which should be set in parallel with each other, during the assembly.

Materials for composing the heat sink preferably have excellent heat conductivity and have thermal expansion coefficient close to that of element such as the semiconductor light emitting element, examples of which include AlN, SiC, CuW, Cu, diamond BN and covar.

In general, the foregoing materials available as base materials for the heat sink are classified into those with electro-conductivity and those with insulating property. Even insulating material can show effective conductivity if the entire surface thereof is covered with a electro-conductive material such as metal.

In general, it is preferable that the second heat sink is electrically insulated from the third heat sink, and that the first heat sink or second heat sink is kept in conduction with the semiconductor light emitting element through the mounting surface. It is also preferable that the first heat sink is kept in conduction with the element through another surface conducting with the surface in contact with such element. This is because the current injection to the semiconductor light emitting element then can be done simply by bonding lead wires on the top surface of the element mounting surface, and because the grounding of the semiconductor light emitting element can be isolated from the third heat sink etc. In an example shown in FIG. 1, electric current flows in the route gold wires 17→first heat sink 11→semiconductor light emitting element 14, and the Ti/Pt/Au layer 16 contacting with the second heat sink 12, and the semiconductor light emitting element 14→gold wires 18.

The present invention is applicable to high-power semiconductor laser diode, which requires a lead wire capable of injecting a large current to the semiconductor laser element. Such lead wire serves as an electrical connection between a COS and the external portion, and the electrical connection with the COS is preferably attained by ultra-sonic fusion.

It is generally recommended that such lead wire has a large diameter, so that bonding of such thick lead wire for example onto the first heat sink on the semiconductor light emitting element requires high-power ultrasonic wave. Such process may, however, cause degradation of the semiconductor light emitting element, or may exert adverse effects on the reliability thereof.

Therefore, the lead wire, especially such that directly brought into contact with a part of the COS, preferably has a diameter of 30 μm or less so as to allow such wire to be fused by the ultrasonic wave at an intensity not causing damage to the element. If a larger current is to be injected, it is preferable that a plurality of lead wires are used for connecting a pair of portions not connected with each other directly.

Such lead wire is preferably a gold wire including gold as a major component. It is a general practice for the gold wire to be intentionally added with impurities such as copper in order to attain a necessary strength, so that it is a rare case that so-called gold wires used for the lead wire are made of pure gold. Since a 25-μm diameter gold wire may sometimes result in breakage upon injection of current at 0.5 to 1 A or around, the current injection path is preferably ensured by a plurality of gold wires especially for high-power laser diodes. For example, three gold wires are preferably used so as to ensure the conduction for an element designed for current injection at around 2 A.

Features of the present invention will now be more specifically described referring to Examples and Comparative Examples. Materials, amount of use thereof, ratio of use, operations, procedures or the like can properly be modified without departing from the spirit of the present invention. It is therefore to be understood that the present invention is by no means limited to the specific examples explained below. It should also be noted that although the drawings referred in the following Examples may be drawn in a dimensional balance different from that in the actual one for easy understanding of the structure, all dimensions follow the description below.

EXAMPLE 1

The semiconductor light emitting device was fabricated according to the procedures below, where FIG. 1 shows a sectional view of such device as viewed from the direction of light emission, and FIG. 2 shows a schematic view thereof as viewed from the direction of the p-side electrode.

First, a groove-type laser element shown in FIG. 4 was fabricated. On the (100) surface of the n-type GaAs substrate 101 having a carrier concentration of $1\times10^{18}$ cm$^3$, an n-type GaAs layer of 1 μm thick having a carrier concentration of $1\times10^{18}$ cm$^{-3}$ as the buffer layer 102, and an n-type $Al_{0.35}Ga_{0.65}As$ layer of 2.2 μm thick having a carrier concentration of $1\times10^{18}$ cm$^{-3}$ as the first-conduction-type clad layer 103 were formed by the MBE method. A double quantum well (DQW) structure was then formed thereon, which comprises an undoped GaAs optical guide layer of 30 nm thick and two undoped $In_{0.16}Ga_{0.84}As$ layers of 6 nm thick provided thereon, separated from each other by an undoped GaAs layer 10 nm thick. Further thereon, the active layer 104 including an undoped GaAs optical guide layer 30 nm thick; a p-type $Al_{0.35}Ga_{0.65}As$ layer of 0.1 μm thick having a carrier concentration of $9\times10^{17}$ cm$^{-3}$ as the second-conduction-type first clad layer 105; an n-type $Al_{0.39}Ga_{0.61}As$ layer 0.5 μm thick having a carrier concentration of $5\times10^{17}$ cm$^{-3}$ as the current blocking layer 106; and an n-type GaAs layer 10 nm thick having a carrier concentration of $1\times10^{18}$ cm$^{-3}$ as the cap layer 107 were stacked in this order.

A silicon nitride mask was then patterned on the uppermost surface in the portion excluding the current injection area. The width of the opening of such silicon nitride mask was set at 1.5 μm. Etching was then performed at 25° C. for 32 seconds through such opening of the mask to thereby remove the cap layer 107 and the current blocking layer 106 over the current injection area. A mixed solution of sulfuric acid (98 wt %), hydrogen peroxide (30 wt % aqueous solution) and water in a volume ratio of 1:1:5 was used for the etching.

Thereafter a p-type $Al_{0.35}Ga_{0.65}As$ layer having a carrier concentration of $1\times10^{18}$ cm$^{-3}$ was grown by the MOCVD method as the second-conduction-type second clad layer 108 so as to attain a thickness of 2.2 μm in the embedded area (current injection area). A p-type GaAs layer having a carrier concentration of $1\times10^{19}$ cm$^{-3}$ was then formed thereon as the contact layer 109 for ensuring desirable contact with the electrode so as to attain a thickness of 3.5 μm.

Then a Ti/Pt/Au stacked film having a thickness of 70 nm/70 nm/80 nm was then evaporated as a p-type electrode 110, the substrate having an initial thickness of 350 μm was then polished to reduce the thickness as thin as 120 μm, an AuGeNi/Au stacked film having a thickness of 150 nm/80 nm was evaporated as an n-type electrode 111, and the obtained stack was annealed at 400° C. for 5 minutes for alloying to thereby complete the wafer for producing semiconductor light emitting elements.

The width $W_b$ of the current injection area of thus completed semiconductor laser element was found to be 2.2 μm.

Next, the wafer was cleaved in the air to produce laser bars having a cavity length of 1,000 μm to thereby expose the facets, and a coating was then formed on the front facet by forming an $AlO_x$ film of 165 nm thick so as to attain a reflectivity of the front facet of 2.5% at an oscillation wavelength of 980 nm. The rear facet was then provided with a four-layered coating of $AlO_x$/amorphous Si/$AlO_x$/amorphous Si having a thickness of 170 nm/60 nm/170 nm/60 nm, to thereby attain a reflectivity of the rear facet of 92%.

After the coating, the laser bars were subjected to secondary cleavage to produce the individual semiconductor laser elements, to which functions for current injection and heat radiation were added to thereby complete the semiconductor light emitting devices.

An AlN sub-mount, having no electro-conductivity in the direction of thickness, was procured as the second heat sink 12. The second heat sink 12 is preliminarily evaporated with a Ti/Pt/Au layer 16 on a wetting (affinity) improving layer 19, laser mounting surface and surfaces parallel thereto in order to ensure only the conductivity within the surface, where only the laser mounting portion was further evaporated with an AuSn solder 15c so as to be stacked on the Ti/Pt/Au layer 16. On the other hand, an AlN sub-mount, which is entirely covered with a Ti/Pt/Au layer 16 so as to ensure the electro-conductivity in the direction of thickness, was prepared as the first heat sink 11, where over the entire laser mounting portion an AuSn solder layer 15a was further formed by evaporation on the Ti/Pt/Au layer 16.

First, the semiconductor light emitting element 14 was mounted on the second heat sink 12 under the normal temperature so as to allow the n-side electrode thereof to contact with the second heat sink 12 while aligning the edge of the second heat sink 12 and the front facet of the element 14; an AuSn solder layer of 85 μm thick is then placed on the wetting (affinity) improving layer 19; the first heat sink 11 is positioned so that the edge thereof is recessed by 25 μm to the rear of the facet of the semiconductor laser element 14 as shown in FIG. 2; mounted to be in contact with the AuSn solder layer 85 μm thick and with a part of the p-side electrode; the temperature was raised to 290 under 30 g load, to thereby join the first heat sink 11, second heat sink 12 and semiconductor laser element 14 to complete a COS, the semiconductor light emitting device. In such process, excess AuSn solder was found to flow from the portions contacting the first heat sink 11 and second heat sink 12 into the area removed from both. A stem containing CuW for current injection was then prepared as a third heat sink 13, and the COS was then joined therewith again using the AuSn solder 15d so as to allow the bottom plane of the second heat sink 12 to contact with such third heat sink 13. Thereafter, the portion of the first heat sink 11 covered with the Ti/Pt/Au layer 16 was bonded with three gold wires 17 of 25 μm diameter by ultrasonic fusion process to thereby produce the p-side electrode, and the second heat sink 12 covered with the Ti/Pt/Au layer 16 was also bonded with three gold wires 18 of 25 μm diameter by ultrasonic fusion process to thereby produce the n-side electrode to allow current injection. The entire structure was sealed in a nitrogen atmosphere to be completed as a can package.

Figure 6:
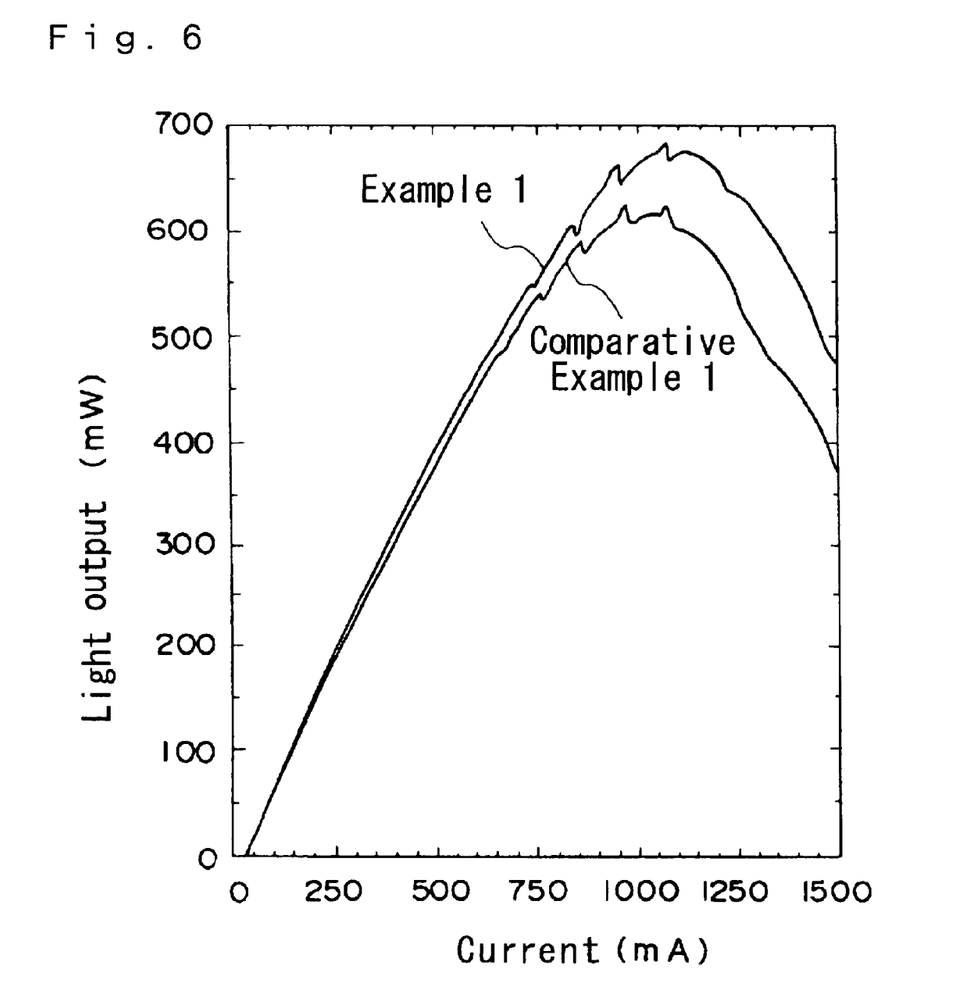
FIG. 6 is a graph comparatively showing current-versus-light output characteristics of Example 1 and Comparative Example 1.

FIG. 6 shows current-light output characteristics of such can package at 25° C. under injection with current as much as 1.5 A. It was found that the device showed a threshold current of 20.7 mA, a slope efficiency of 0.91 mW/mA, maximum light output of 674 mW, and a current producing such maximum light output of 1,115 mA.

EXAMPLE 2

The semiconductor light emitting device was fabricated similarly to Example 1 except that a CuW thin plate was used as the third heat sink 13 as shown in FIG. 3, under which a Peltier cooler was provided, an optical fiber 20 having a wedge-shaped fiber lens 21 was located so as to face the front facet of the semiconductor light emitting laser element, the device was made into a butterfly package, and that the semiconductor laser element was mounted on the second heat sink so as to be recessed towards the rear facet by approximately 10 μm. The device showed, upon input of the light emitted from the fiber end, a threshold current of 18.5 mA and a slope efficiency of 0.71 mW/mA.

EXAMPLE 3

The semiconductor light emitting device was fabricated similarly to Example 1 except that the semiconductor light emitting element was fabricated as below, and the first heat sink was made of diamond.

The semiconductor light emitting element was fabricated similarly to Example 1 except that the cavity length was defined as 1,200 μm, and that the opening of the silicon nitride mask was formed in a shape such that having a stripe pattern of 5.1 μm wide, the surface extending from the front facet of the element to a position recessed by 250 μm towards the rear facet, having a gradually narrowed pattern over the first 450 μm, and finally having stripe pattern of 1.5 μm wide over the residual 500 μm range forward the rear facet.

Figure 7:
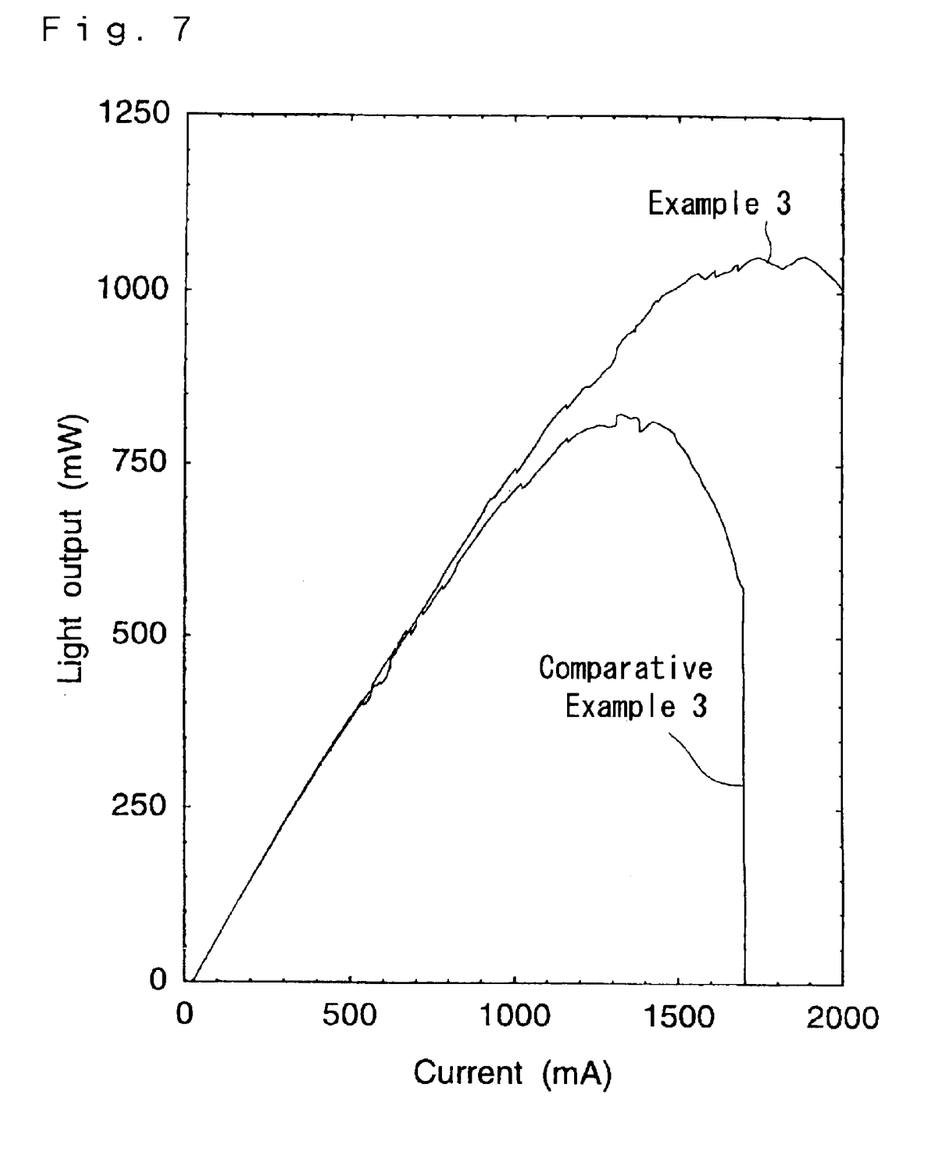
FIG. 7 is a graph comparatively showing current-versus-light output characteristics of Example 3 and Comparative Example 3.

Current-light output characteristics of such can package injected with electric current up to 2.0 A at 25° C. was shown in FIG. 7. The device was found to have a threshold current of 23.1 mA, a slope efficiency of 0.84 mW/mA, a maximum light output of 1,052 mW and the current producing such maximum light output of 1,883 mA. No breakdown of the element was observed even when the current injection was increased up to 2 A.

COMPARATIVE EXAMPLE 1

The semiconductor light emitting device was fabricated similarly to Example 1 except that the first heat sink was not used, and first-conduction-type lead wires were directly fusion bonded on the p-side electrode of the semiconductor laser element. Current-light output characteristics of such can package injected with electric current up to 1.5 A at 25° C. was shown in FIG. 6. The device was found to have a threshold current of 20.8 mA, a slope efficiency of 0.83 mW/mA, a maximum light output of 626 mW and the current producing such maximum light output of 970 mA.

COMPARATIVE EXAMPLE 2

The semiconductor light emitting device was fabricated similarly to Example 2 except that first-conduction-type lead wires were directly fusion bonded on the p-side electrode of the semiconductor laser element without using the first heat sink. The device showed, upon input of the light emitted from the fiber end, a threshold current of 18.9 mA and a slope efficiency of 0.65 mW/mA.

COMPARATIVE EXAMPLE 3

The semiconductor light emitting device was fabricated similarly to Example 3 except that first-conduction-type lead wires were directly fusion bonded on the p-side electrode of the semiconductor laser element without using the first heat sink. Current-light output characteristics of such can package injected with electric current up to 2.0 A at 25° C. was shown in FIG. 7. The device was found to have a threshold current of 24.9 mA, a slope efficiency of 0.83 mW/mA, a maximum light output of 821 mW and the current producing such maximum light output of 1,329 mA. The element broke down upon injection of current of approximately 1.7 A.

Industrial Applicability

The semiconductor light emitting device of the present invention is provided with an excellent heat spreading for the semiconductor light emitting element contained therein, and can be easily assembled even if there are dimensional errors in the components or the element composing the semiconductor light emitting device. By virtue of simple procedures for optical coupling with an optical fiber etc., the semiconductor light emitting device of the present invention is widely applicable in semiconductor modules etc.

What is claimed is:

1. A semiconductor light emitting device comprising at least one semiconductor light emitting element of edge-emission type, a first heat sink and a second heat sink, wherein at least a part of an electrode for a first-conduction-type semiconductor of the semiconductor light emitting element is in thermally joining contact with the first heat sink;

at least a part of an electrode for a second-conduction-type semiconductor of the semiconductor light emitting element is in thermally joining contact with the second heat sink; and the first heat sink and the second heat sink are either in thermally joining direct contact or in the thermally joining contact with interposition of an adhesive in a junction overlooking one of the two side planes which do not compose facets of a cavity in the semiconductor light emitting element.

2. The semiconductor light emitting device as claimed in claim 1, wherein a portion of the electrode for the first-conduction-type semiconductor of the semiconductor light emitting element is not in contact with the first heat sink in the vicinity of the front facet of the element; and a portion of the electrode for the second-conduction-type semiconductor of the semiconductor light emitting element is in contact with the second heat sink in the vicinity of the front facet of the element.

3. The semiconductor light emitting device as claimed in claim 1, wherein the surface of the first heat sink which is kept in contact with the semiconductor light emitting element has an effective electro-conductivity with at least one surface which is not kept in contact with the semiconductor light emitting element.

4. The semiconductor light emitting device as claimed in claim 1, wherein a surface of the second heat sink which is kept in contact with the semiconductor light emitting element has no electro-conductivity with any surface which is not kept in contact with the semiconductor light emitting element.

5. The semiconductor light emitting device as claimed in claim 1, wherein the diameter of a lead wire for introducing electric current to the semiconductor light emitting element and which is kept in contact with at least one of the group consisting of semiconductor light emitting element, the first heat sink and the second heat sink is 35 μm or less; and a pair of portions not connected directly with each other are connected with each other with a plurality of lead wires.

6. The semiconductor light emitting device as claimed in claim 1, wherein a groove is provided in the vicinity of the junction of the first heat sink and the second heat sink, into which an adhesive is provided on a protrusion part of the second heat sink to join the first heat sink and the second heat sink: wherein the groove prevent an excessive adhesive from reaching the semiconductor light emitting element.

7. The semiconductor light emitting device as claimed in claim 1, wherein at least a part of the electrode for the first-conduction-type semiconductor is in contact with the first heat sink, interposed with a first adhesive;

at least a part of the first heat sink is in contact with the second heat sink, interposed with a second adhesive; and the total weight of the second adhesive is twice or more heavier than the total weight of the first adhesive.

8. The semiconductor light emitting device as claimed in claim 7, wherein the total weight of the second adhesive is five times or more heavier than the total weight of the first adhesive.

9. These semiconductor light emitting device as claimed in claim 1, wherein at least one of the electrodes of the semiconductor light emitting element has an Au layer having a thickness of 30 to 100 µm.

10. The semiconductor light emitting device as claimed in claim 1, wherein the first conduction type is p-type, and the second conduction type is n-type.

11. The semiconductor light emitting device as claimed in claim 1, wherein the semiconductor light emitting element is a semiconductor laser diode, and the front facet thereof is connected to an optical fiber so as to compose a semiconductor laser module.

12. The semiconductor light emitting device as claimed in claim 11, wherein the tip of the optical fiber has a light condensation focusing function, and is processed so as to be optically coupled directly with the front facet of the semiconductor laser diode.

13. The semiconductor light emitting device as claimed in claim 1, wherein the adhesive is a solder material.

14. The semiconductor light emitting device as claimed in claim 1, wherein the solder material contains AuGe, AuSn, AgSn, PbSn, InSn, SnBi or In.

15. The semiconductor light emitting device as claimed in claim 1, wherein at least a part of an electrode for the e first-conduction-type semiconductor of the semiconductor light emitting element and the first heat sink are either in thermally joining direct contact or in thermally joining contact with interposition of an adhesive.

16. The semiconductor light emitting device as claimed in claim 1, wherein at least a part of an electrode for the second-conduction-type semiconductor of the semiconductor light emitting element and the second heat sink are either in thermally joining direct contact or in thermally joining contact with interposition of an adhesive.

* * * * *